(12) United States Patent
Alsaqqa et al.

(10) Patent No.: US 12,535,743 B2
(45) Date of Patent: Jan. 27, 2026

(54) RADIATION SOURCE ARRANGEMENT AND METROLOGY DEVICE

(71) Applicants: ASML NETHERLANDS B.V., Veldhoven (NL); ASML HOLDING N.V., Veldhoven (NL)

(72) Inventors: Ali Alsaqqa, Norwalk, CT (US); Aabid Patel, Stamford, CT (US); Patrick Sebastian Uebel, Marloffstein (DE); Amir Abdolvand, Eindhoven (NL); Paulus Antonius Andreas Teunissen, Eindhoven (NL); Wisham F Kadhim, Shelton, CT (US)

( * ) Notice: Subject to any disclaimer, the term of this patent is extended or adjusted under 35 U.S.C. 154(b) by 495 days.

(21) Appl. No.: 18/021,905

(22) PCT Filed: Aug. 3, 2021

(86) PCT No.: PCT/EP2021/071634
§ 371 (c)(1),
(2) Date: Feb. 17, 2023

(87) PCT Pub. No.: WO2022/048843
PCT Pub. Date: Mar. 10, 2022

(65) Prior Publication Data
US 2024/0004308 A1 Jan. 4, 2024

Related U.S. Application Data

(60) Provisional application No. 63/074,000, filed on Sep. 3, 2020.

(30) Foreign Application Priority Data

Sep. 11, 2020 (EP) ..................................... 20195746

(51) Int. Cl.
*G03F 7/00* (2006.01)
*G02F 1/35* (2006.01)

(52) U.S. Cl.
CPC ........ *G03F 7/70625* (2013.01); *G02F 1/3523* (2013.01); *G03F 7/70041* (2013.01); *G03F 7/70558* (2013.01)

(58) Field of Classification Search
CPC ............. G03F 7/70625; G03F 7/70041; G03F 7/70558; G03F 7/70616; G02F 1/3523
(Continued)

(56) References Cited

U.S. PATENT DOCUMENTS 6,961,116 B2   11/2005   Den Boef et al.
9,160,137 B1   10/2015   Abdolvand et al.
(Continued)

FOREIGN PATENT DOCUMENTS

EP    1628164      2/2006
TW    200908928    3/2009
(Continued)

OTHER PUBLICATIONS

International Search Report and Written Opinion issued in corresponding International Application No. PCT/EP2021/071634, dated Oct. 29, 2021.

(Continued)

*Primary Examiner* — Caleen O Sullivan
(74) *Attorney, Agent, or Firm* — Pillsbury Winthrop Shaw Pittman, LLP

(57) ABSTRACT

A radiation source arrangement including: a radiation source operable to generate source radiation including source energy pulses; and at least one non-linear energy-filter operable to filter the source radiation to obtain filtered radiation including filtered energy pulses. The at least one non-linear energy-filter is operable to mitigate variation in energy in the filtered radiation by reducing the energy level of the source energy pulses which have an energy level corresponding to one of both extremities of an energy (Continued)

distribution of the source energy pulses by a greater amount than the source energy pulses which have an energy level corresponding to a peak of the energy distribution.

20 Claims, 7 Drawing Sheets

(58) Field of Classification Search
USPC .......................................................... 355/67
See application file for complete search history.

(56) References Cited

U.S. PATENT DOCUMENTS

| | | |
|---|---|---|
| 2004/0015085 A1 | 1/2004 | Soh et al. |
| 2004/0239907 A1 | 12/2004 | Hintersteiner et al. |
| 2009/0195768 A1 | 8/2009 | Bijnen et al. |
| 2009/0310111 A1 | 12/2009 | Arif |
| 2010/0328655 A1 | 12/2010 | Den Boef |
| 2011/0026032 A1 | 2/2011 | Den Boef et al. |
| 2011/0102753 A1 | 5/2011 | Van De Kerkhof et al. |
| 2011/0249244 A1 | 10/2011 | Leewis et al. |
| 2012/0044470 A1 | 2/2012 | Smilde et al. |
| 2015/0261097 A1 | 9/2015 | Mathijssen et al. |
| 2016/0161863 A1 | 6/2016 | Den Boef et al. |
| 2016/0370717 A1 | 12/2016 | Den Boef et al. |
| 2020/0264521 A1 | 8/2020 | Scholtes-Van Eijk et al. |

FOREIGN PATENT DOCUMENTS

| | | |
|---|---|---|
| WO | 2017/032454 | 3/2017 |
| WO | 2017/186491 | 11/2017 |
| WO | 2018/127266 | 7/2018 |

OTHER PUBLICATIONS

Search Report issued in the corresponding European Patent Application No. 20195746 dated Mar. 9, 2021.

D. Manzani et al., "Nonlinear Optical Properties of Tungsten Lead-Pyrophosphate Glasses Containing Metallic Copper Nanoparticles", Plasmonics, 8:1667-1674 (2013).

X. Dong et al., "Q-switched mode-locked Nd:GGG waveguide laser with tin disulfide as saturable absorber", Optical Materials, 100:109701-109702 (2020).

(a)

(b)

RADIATION SOURCE ARRANGEMENT AND METROLOGY DEVICE

CROSS REFERENCE TO RELATED APPLICATIONS

This application is the U.S. national phase entry of PCT Patent Application No. PCT/EP2021/071634 which was filed on Aug. 3, 2021, which claims priority of U.S. Provisional Patent Application No. 63/074,000 which was filed on Sep. 3, 2020 and of European Patent Application No. 20195746.1 which was filed on Sep. 11, 2020 and which are incorporated herein in their entireties by reference.

FIELD

The present invention relates to a light source, in particular, a broadband light source for use in a lithographic apparatus or metrology tools.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low $k_1$.

A metrology apparatus can be used to measure parameters of interest of structures on the substrate. For example, a metrology apparatus can be used to measure parameters such as critical dimension, overlay between layers on the substrate, asymmetry of a pattern on the substrate and the position of this pattern relative to the wafer. Rays of measurement radiation are used to illuminate the substrate. The radiation is diffracted by the structure on the substrate. The diffracted radiation is collected by an objective lens and captured by a sensor.

The rays of measurement radiation are provided by light emitted by a light source. This light is directed onto the substrate via a beam splitter and the objective lens that collects the diffracted radiation from the substrate.

The light source providing measurement radiation may be a broadband light source. The broadband light source may have a pulse-to-pulse amplitude variation or radiation noise, which has a negative impact on measurement reproducibility (or precision) and therefore measurement accuracy. The light source may also be a narrow band light source, and suffers from the same pulse-to-pulse amplitude variation issue.

It is desirable to reduce or mitigate this radiation noise.

SUMMARY

According to a first aspect, there is provided a radiation source arrangement comprising: a radiation source operable to generate source radiation comprising source energy pulses; and at least one non-linear energy-filter being operable to filter said source radiation to obtain filtered radiation comprising filtered energy pulses; wherein said at least one non-linear energy-filter is operable to mitigate variation in energy in said filtered radiation by reducing the energy level of said source energy pulses which have an energy level corresponding to one of both extremities of an energy distribution of said source energy pulses by a greater amount than said source energy pulses which have an energy level corresponding to a peak of said energy distribution.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1A:
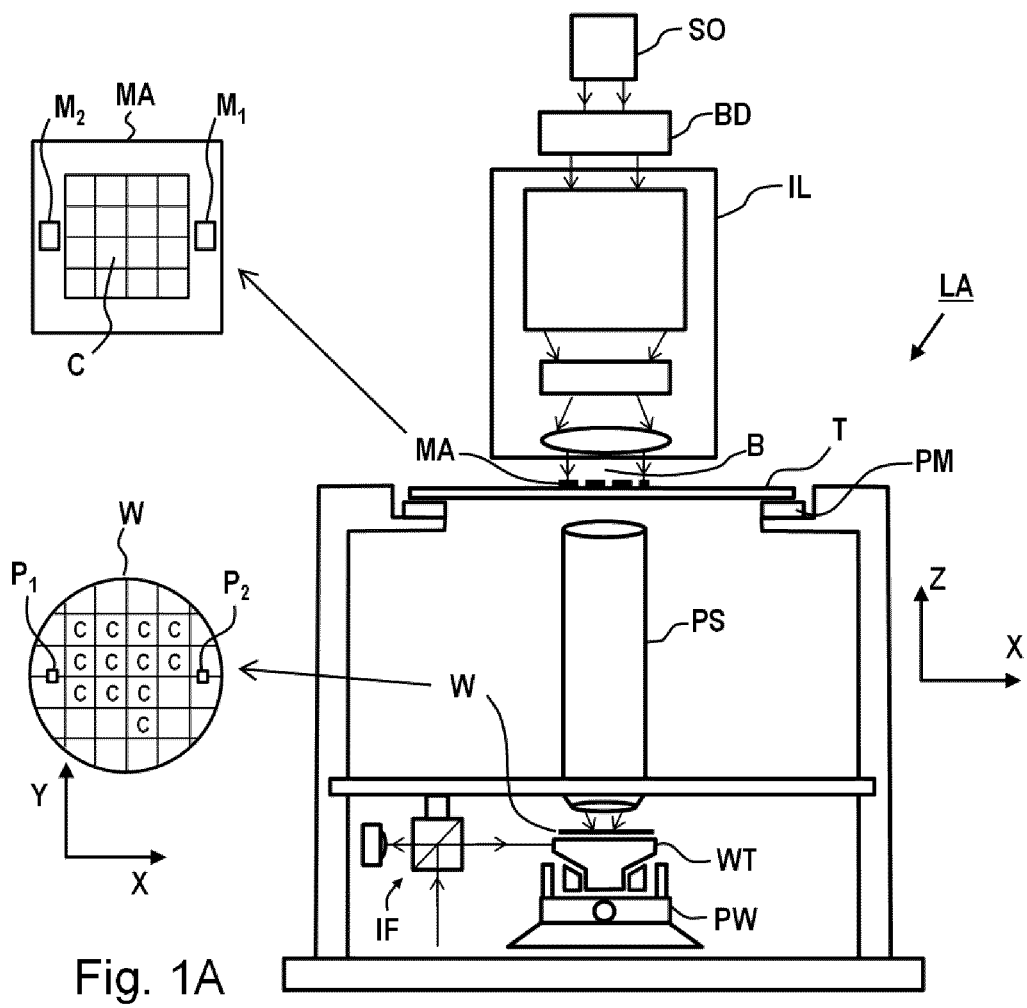
FIG. 1A depicts a schematic overview of lithographic apparatus.

FIG. 1A schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1A) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 1B:
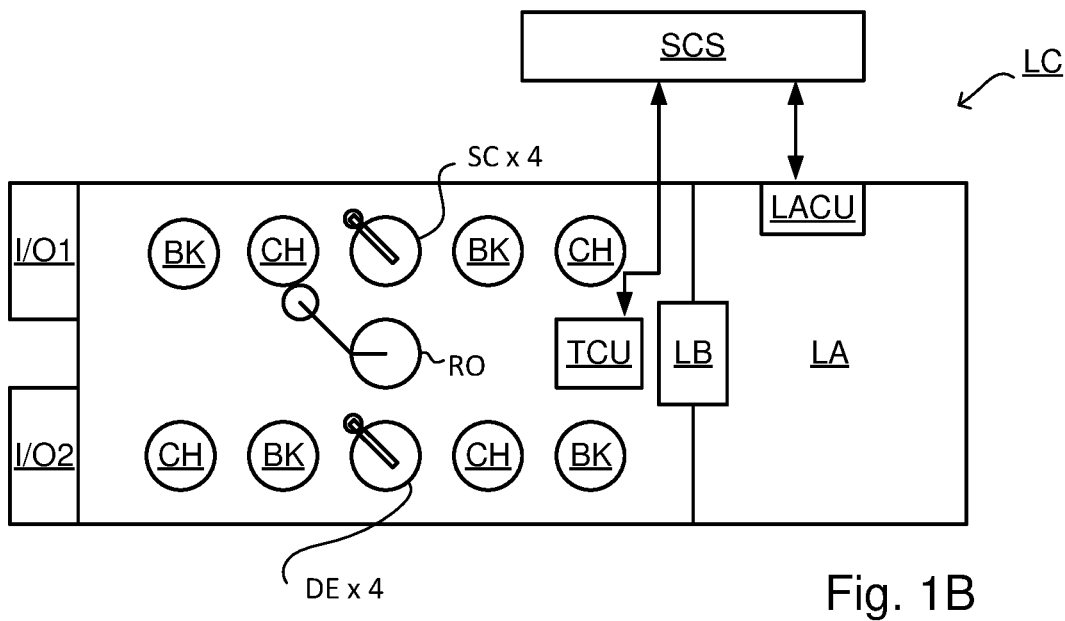
FIG. 1B depicts a schematic overview of a lithographic cell.

As shown in FIG. 1B the lithographic apparatus LA may form part of a lithographic cell LC, also sometimes referred to as a lithocell or (litho) cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 2:
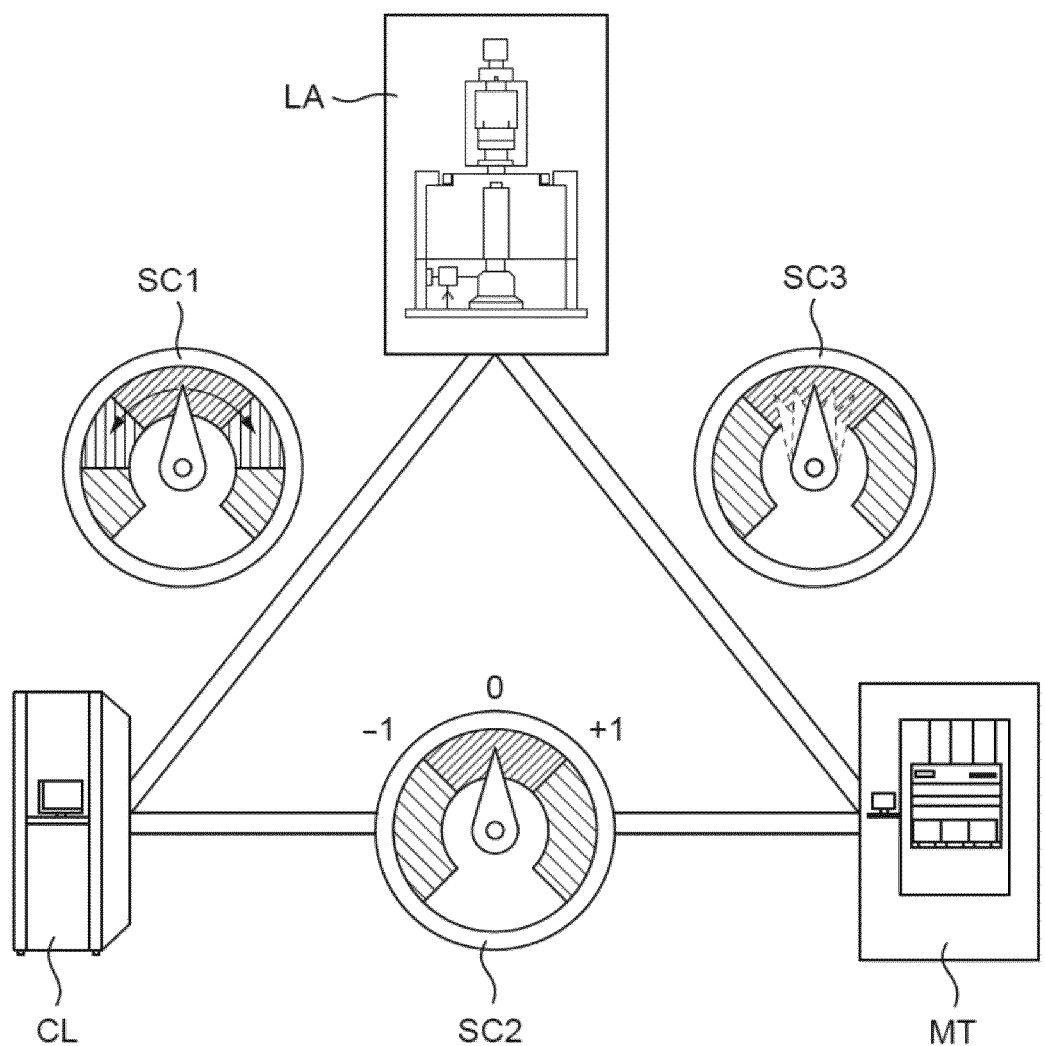
FIG. 2 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 2. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 2 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 2 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 2 by the multiple arrows in the third scale SC3).

In lithographic processes, it is desirable to make frequent measurements of the structures created, e.g., for process control and verification. Different types of metrology apparatus MT for making such measurements are known, including scanning electron microscopes or various forms of scatterometer metrology apparatus MT.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164, incorporated herein by reference in their entirety. Aforementioned scatterometers may measure gratings using light from embodiment of light sources that are discussed in this document.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety. The light sources of this document may be configured to be controllable in respect to the light source requirements of these substrate measurement recipes.

A lithographic apparatus may include one or more (e.g. a plurality of) alignment sensors by which positions of alignment marks provided on a substrate or wafer can be measured accurately. Alignment (or position) sensors may use optical phenomena such as diffraction and interference to obtain position information from alignment marks formed on the substrate or wafer. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all of these publications are incorporated herein by reference.

A mark, or alignment mark, may comprise a series of bars formed on or in a layer provided on the substrate or formed (directly) in the substrate. The bars may be regularly spaced and act as grating lines so that the mark can be regarded as a diffraction grating with a well-known spatial period (pitch). Depending on the orientation of these grating lines, a mark may be designed to allow measurement of a position along the X axis, or along the Y axis (which is oriented substantially perpendicular to the X axis). A mark comprising bars that are arranged at +45 degrees and/or −45 degrees with respect to both the X- and Y-axes allows for a combined X— and Y— measurement using techniques as described in US2009/195768A, which is incorporated by reference.

The alignment sensor scans each mark optically with a spot of radiation to obtain a periodically varying signal, such as a sine wave. The phase of this signal is analyzed, to determine the position of the mark and, hence, of the substrate relative to the alignment sensor, which, in turn, is fixated relative to a reference frame of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose.

Measuring the position of the marks may also provide information on a deformation of the substrate on which the marks are provided, for example in the form of a wafer grid.

Deformation of the substrate may occur by, for example, electrostatic clamping of the substrate to the substrate table and/or heating of the substrate when the substrate is exposed to radiation.

Figure 3A:
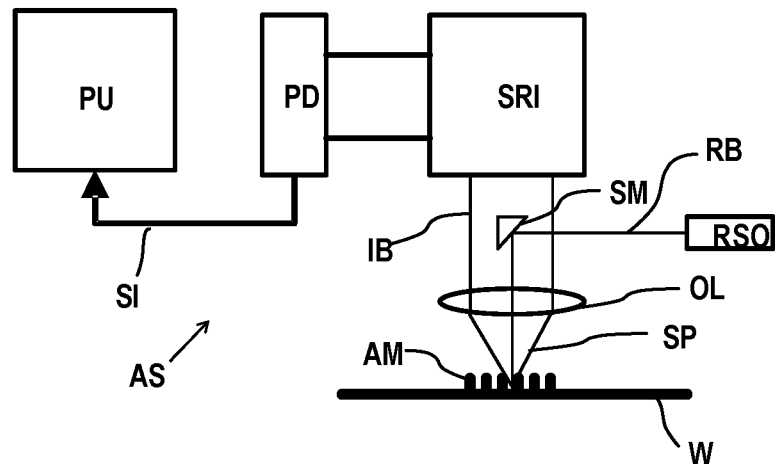
FIG. 3A depicts a schematic block diagram of an alignment sensor.

FIG. 3A is a schematic block diagram of an embodiment of a known alignment sensor AS, such as is described, for example, in U.S. Pat. No. 6,961,116, and which is incorporated by reference. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The radiation source RSO may be provided by embodiments of the light source of the disclosure of this document. The illumination spot SP, by which the mark AM is illuminated, may be slightly smaller in diameter than the width of the mark itself.

Radiation diffracted by the mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

A topography measurement system, level sensor or height sensor, and which may be integrated in the lithographic apparatus, is arranged to measure a topography of a top surface of a substrate (or wafer). A map of the topography of the substrate, also referred to as height map, may be generated from these measurements indicating a height of the substrate as a function of the position on the substrate. This height map may subsequently be used to correct the position of the substrate during transfer of the pattern on the substrate, in order to provide an aerial image of the patterning device in a properly focus position on the substrate. It will be understood that "height" in this context refers to a dimension broadly out of the plane to the substrate (also referred to as Z-axis). Typically, the level or height sensor performs measurements at a fixed location (relative to its own optical system) and a relative movement between the substrate and the optical system of the level or height sensor results in height measurements at locations across the substrate.

Figure 3B:
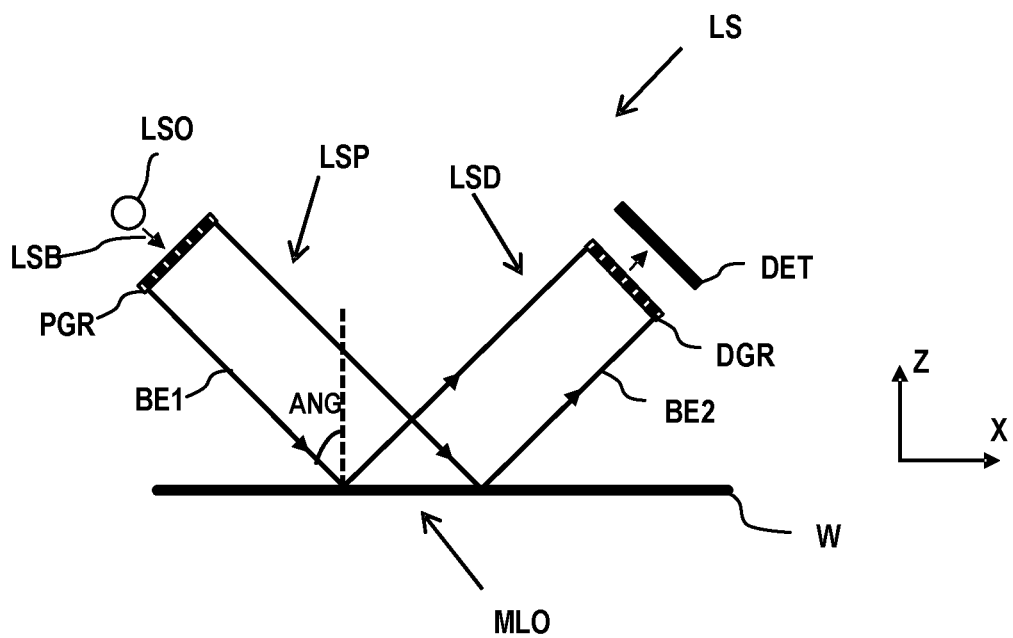
FIG. 3B depicts a schematic block diagram of a level sensor.

An example of a level or height sensor LS as known in the art is schematically shown in FIG. 3B, which illustrates only the principles of operation. In this example, the level sensor comprises an optical system, which includes a projection unit LSP and a detection unit LSD. The projection unit LSP comprises a radiation source LSO providing a beam of radiation LSB which is imparted by a projection grating PGR of the projection unit LSP. The radiation source LSO may comprise an embodiment of the disclosure of this document.

The present disclosure is directed towards improving the operable lifetime of a light source, or improving its noise performance. The light source referred to here may be a broadband light source comprising a hollow-core photonic crystal fiber (HC-PCF). The broadband light source of the present disclosure may be used in metrology tools such as scatterometers, alignment sensors, height or level sensors as described above. In general, these two aspects of light sources, namely lifetime and noise performance, are contradictory. Specifically, lifetime can be improved by reducing the repetition rate of the light source. However, the smaller repetition rate, the larger the observed pulse-to-pulse variation. This is because the detector, for example a photodiode, measures the optical signal by integrating over a period of time. Within this period, if there are, say, 100 laser pulses, then the result is effectively an average of these pulses. Statistically, averaging over a large number of pulses results in data points which are less noisy; by contrast, at the opposite extent, if there is only one pulse, the noise will be more apparent. The concepts disclosed here reduces the pulse-to-pulse variation (noise), thereby enabling noise performance to be traded for lifetime, by reducing the repetition rate while maintaining a given performance level.

Metrology tools MT, such as a scatterometer, topography measurement system, or position measurement system mentioned above may use radiation originating from a radiation source to perform a measurement. The properties of the radiation used by a metrology tool may affect the type and quality of measurements that may be performed. For some applications, it may be advantageous to use multiple radiation frequencies to measure a substrate, for example broadband radiation may be used. Multiple different frequencies may be able to propagate, irradiate, and scatter off a metrology target with no or minimal interference with other frequencies. Therefore different frequencies may for example be used to obtain more metrology data simultaneously. Different radiation frequencies may also be able to interrogate and discover different properties of a metrology target. Broadband radiation may be useful in metrology systems MT such as for example level sensors, alignment mark measurement systems, scatterometry tools, or inspection tools. A broadband radiation source may be a supercontinuum source.

High quality broadband radiation, for example supercontinuum radiation, may be difficult to generate. One method for generating broadband radiation may be to broaden high-power narrow band or single frequency input radiation, for example by making use of non-linear, higher order effects. The input radiation (which may be produced using a laser) may be referred to as pump radiation. Alternatively, the input radiation may be referred to as seed radiation. To obtain high power radiation for broadening effects, radiation may be confined into a small area so that strongly localised high intensity radiation is achieved. In those areas, the radiation may interact with broadening structures and/or materials forming a non-linear medium so as to create broadband output radiation. In the high intensity radiation areas, different materials and/or structures may be used to enable and/or improve radiation broadening by providing a suitable non-linear medium.

In some implementations, the broadband output radiation is created in a photonic crystal fiber (PCF). In several embodiments, such a photonic crystal fiber has microstructures around its fiber core assisting in confining radiation that travels through the fiber in the fiber core. The fiber core can be made of a solid material that has non-linear properties and that is capable of generating broadband radiation when high intensity pump radiation is transmitted through the fiber core. Although it is feasible to generate broadband radiation in solid core photonic crystal fibers, there may be a few disadvantages of using a solid material. For example, if UV radiation is generated in the solid core, this radiation might not be present in the output spectrum of the fiber because the radiation is absorbed by most solid material.

In some implementations, as discussed further below with reference to FIG. 5, methods and apparatus for broadening input radiation may use a fiber for confining input radiation, and for broadening the input radiation to output broadband radiation. The fiber may be a hollow core fiber, and may comprise internal structures to achieve effective guiding and confinement of radiation in the fiber. The fiber may be a hollow core photonic crystal fiber (HC-PCF), which is particularly suitable for strong radiation confinement, predominantly inside the hollow core of the fiber, achieving high radiation intensities. The hollow core of the fiber may be filled with a gas or gas mixture acting as a broadening medium for broadening input radiation. Such a fiber and gas mixture arrangement may be used to create a supercontinuum radiation source. Radiation input to the fiber may be electromagnetic radiation, for example radiation in one or more of the infrared, visible, UV, and extreme UV spectra. The output radiation may consist of or comprise broadband radiation, which may be referred to herein as white light. The output radiation may cover UV, visible and near-infrared range. The exact spectrum and power density of the output radiation will be determined by plurality of parameters, such as fiber structure, gas mix composition, gas pressure, energy of the input radiation, pulse duration and pulse shape of the input radiation.

Some embodiments relate to a new design of such a broadband radiation source comprising an optical fiber. The optical fiber is a hollow-core, photonic crystal fiber (HC-PCF). In particular, the optical fiber may be a hollow-core, photonic crystal fiber of a type comprising anti-resonant structures for confinement of radiation. Such fibers comprising anti-resonant structures are known in the art as anti-resonant fibers, tubular fibers, single-ring fibers, negative curvature fibers or inhibited coupling fibers. Various different designs of such fibers are known in the art. Alternatively, the optical fiber may be photonic bandgap fibers (HC-PBFs, for example a Kagome fiber).

A number of types of HC-PCFs can be engineered, each based on a different physical guidance mechanism. Two such HC-PCFs include: hollow-core photonic bandgap fibers (HC-PBFs) and hollow-core anti-resonant reflecting fibers (HC-ARFs). Detail on the design and manufacture of HC-PCFs can be found in US patent US2004/015085A1 (for HC-PBFs) and International PCT patent application WO2017/032454A1 (for Hollow Core anti-resonant reflecting fibers), which are incorporated herein by reference. FIG. 6(a) shows a Kagome fiber, comprising a Kagome lattice structure.

Figure 4:
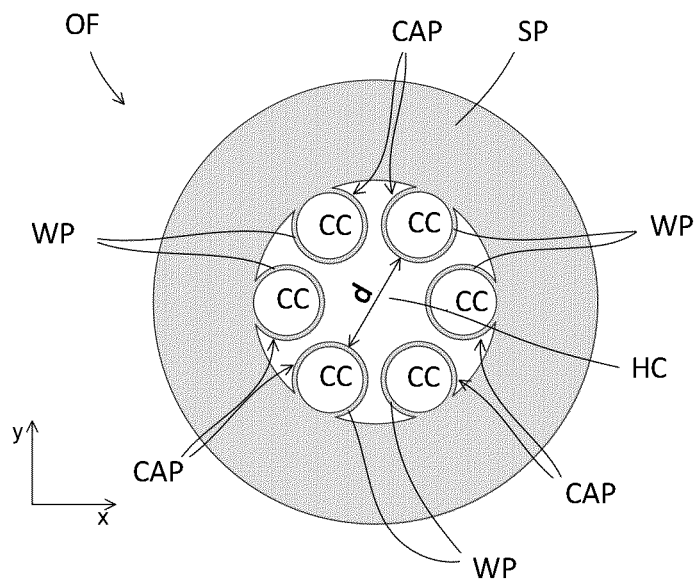
FIG. 4 is a schematic cross sectional view of a hollow core optical fiber that may form part of a radiation source according to an embodiment in a transverse plane (i.e. perpendicular to an axis of the optical fiber)

An example of an optical fiber for use in the radiation source is now described with reference to FIG. 4, which is a schematic cross sectional view of the optical fiber OF in a transverse plane. Further embodiments similar to the practical example of the fiber of FIG. 4 are disclosed in WO2017/0324541.

The optical fiber OF comprises an elongate body, which is longer in one dimension compared to the other two dimensions of the fiber OF. This longer dimension may be referred to as an axial direction and may define an axis of the optical fiber OF. The two other dimensions define a plane which may be referred to as a transverse plane. FIG. 4 shows a cross-section of the optical fiber OF in this transverse plane (i.e. perpendicular to the axis), which is labelled as the x-y plane. The transverse cross-section of the optical fiber OF may be substantially constant along the fiber axis.

It will be appreciated that the optical fiber OF has some degree of flexibility and therefore the direction of the axis will not, in general, be uniform along the length of the optical fiber OF. The terms such as the optical axis, the transverse cross-section and the like will be understood to mean the local optical axis, the local transverse cross-section and so on. Furthermore, where components are described as being cylindrical or tubular these terms will be understood to encompass such shapes that may have been distorted as the optical fiber OF is flexed.

The optical fiber OF may have any length and it will be appreciated that the length of the optical fiber OF may be dependent on the application. The optical fiber OF may have a length between 1 cm and 10 m, or 0.1 cm and 10 m for example, the optical fiber OF may have a length between 10 cm and 100 cm.

The optical fiber OF comprises: a hollow core COR; a cladding portion surrounding the hollow core COR; and a support portion SP surrounding and supporting the cladding portion. The optical fiber OF may be considered to comprise a body (comprising the cladding portion and the support portion SP) having a hollow core COR. The cladding portion comprises a plurality of anti-resonance elements for guiding radiation through the hollow core COR. In particular, the plurality of anti-resonance elements are arranged to confine radiation that propagates through the optical fiber OF predominantly inside the hollow core HC and to guide the radiation along the optical fiber OF. The hollow core HC of the optical fiber OF may be disposed substantially in a central region of the optical fiber OF, so that the axis of the optical fiber OF may also define an axis of the hollow core HC of the optical fiber OF.

The cladding portion comprises a plurality of anti-resonance elements for guiding radiation propagating through the optical fiber OF. In particular, in this embodiment, the cladding portion comprises a single ring of six tubular capillaries CAP. Each of the tubular capillaries CAP acts as an anti-resonance element.

The capillaries CAP may also be referred to as tubes. The capillaries CAP may be circular in cross section, or may have another shape. Each capillary CAP comprises a generally cylindrical wall portion WP that at least partially defines the hollow core HC of the optical fiber OF and separates the hollow core HC from a capillary cavity CC. It will be appreciated that the wall portion WP may act as an anti-reflecting Fabry-Perot resonator for radiation that propagates through the hollow core HC (and which may be incident on the wall portion WP at a grazing incidence angle). The thickness of the wall portion WP may be suitable so as to ensure that reflection back into the hollow core HC is generally enhanced whereas transmission into the capillary cavity CC is generally suppressed. In some embodiments, the capillary wall portion WP may have a thickness between 0.01-10.0 µm.

It will be appreciated that, as used herein, the term cladding portion is intended to mean a portion of the optical fiber OF for guiding radiation propagating through the optical fiber OF (i.e. the capillaries CAP which confine said radiation within the hollow core COR). The radiation may be confined in the form of transverse modes, propagating along the fiber axis.

The support portion is generally tubular and supports the six capillaries CAP of the cladding portion. The six capillaries CAP are distributed evenly around an inner surface if the inner support portion SP. The six capillaries CAP may be described as being disposed in a generally hexagonal formation.

The capillaries CAP are arranged so that each capillary is not in contact with any of the other capillaries CAP. Each of the capillaries CAP is in contact with the inner support portion SP and spaced apart from adjacent capillaries CAP in the ring structure. Such an arrangement may be beneficial since it may increase a transmission bandwidth of the optical fiber OF (relative, for example, to an arrangement wherein the capillaries are in contact with each other). Alternatively, in some embodiments, each of the capillaries CAP may be in contact with adjacent capillaries CAP in the ring structure.

The six capillaries CAP of the cladding portion are disposed in a ring structure around the hollow core COR. An inner surface of the ring structure of capillaries CAP at least partially defines the hollow core HC of the optical fiber OF. The diameter d of the hollow core HC (which may be defined as the smallest dimension between opposed capillaries, indicated by arrow d) may be between 10 and 1000 µm. The diameter d of the hollow core HC may affect the mode field diameter, impact loss, dispersion, modal plurality, and non-linearity properties of the hollow core optical fiber OF.

In this embodiment, the cladding portion comprises a single ring arrangement of capillaries CAP (which act as anti-resonance elements). Therefore, a line in any radial direction from a center of the hollow core HC to an exterior of the optical fiber OF passes through no more than one capillary CAP.

It will be appreciated that other embodiments may be provided with different arrangements of anti-resonance elements. These may include arrangements having multiple rings of anti-resonance elements and arrangements having nested anti-resonance elements. Furthermore, although the embodiment shown in FIG. 4 comprises a ring of six capillaries, in other embodiments, one or more rings comprising any number of anti-resonance elements (for example 4, 5, 6, 7, 8, 9, 10, 11 or 12 capillaries) may be provided in the cladding portion.

FIG. 6(b) shows a modified embodiment of the above discussed HC-PCFs with a single ring of tubular capillaries. In the example of FIG. 6(b) there are two coaxial rings of tubular capillaries 21. For holding the inner and outer rings of tubular capillaries 21, a support tube ST may be included in the HC-PCF. The support tube may be made of silica.

Figure 6:
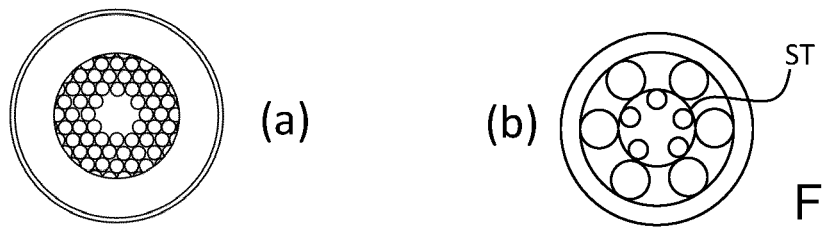
FIGS. 6 (a) and (b) schematically depict the transverse cross-sections of examples of hollow core photonic crystal fiber (HC-PCF) designs for supercontinuum generation, which each may form part of a radiation source according to an embodiment.

The tubular capillaries of the examples of FIG. 4 and FIGS. 6 (a) and (b) may have a circular cross-sectional shape. Other shapes are also possible for the tubular capillaries, like elliptical or polygonal cross-sections. Additionally, the solid material of the tubular capillaries of the examples of FIG. 4 and FIGS. 6 (a) and (b) may comprise plastic material, like PMA, glass, like silica, or soft glass.

Figure 5:
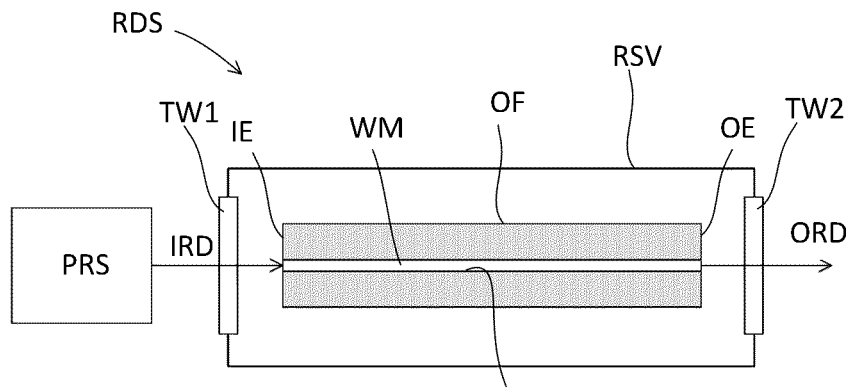
FIG. 5 depicts a schematic representation of a radiation source according to an embodiment for providing broadband output radiation.

FIG. 5 depicts a radiation source RDS for providing broadband output radiation. The radiation source RDS comprises a pulsed pump radiation source PRS or any other type of source that is capable of generating short pulses of a desired length and energy level; an optical fiber OF (for example of the type shown in FIG. 4) with a hollow core HC; and a working medium WM (for example a gas) disposed within the hollow core HC. Although in FIG. 5 the radiation source RDS comprises the optical fiber OF shown in FIG. 4, in alternative embodiments other types of hollow core optical fiber may be used.

The pulsed pump radiation source PRS is configured to provide input radiation IRD. The hollow core HC of the optical fiber OF is arranged to receive the input radiation IRD from the pulsed pump radiation source PRS, and broaden it to provide output radiation ORD. The working medium WM enables the broadening of the frequency range of the received input radiation IRD so as to provide broadband output radiation ORD.

The radiation source RDS further comprises a reservoir RSV. The optical fiber OF is disposed inside the reservoir RSV. The reservoir RSV may also be referred to as a housing, container or gas cell. The reservoir RSV is configured to contain the working medium WM. The reservoir RSV may comprise one or more features, known in the art, for controlling, regulating, and/or monitoring the composition of the working medium WM (which may be a gas) inside the reservoir RSV. The reservoir RSV may comprise a first transparent window TW1. In use, the optical fiber OF is disposed inside the reservoir RSV such that the first transparent window TW1 is located proximate to an input end IE of the optical fiber OF. The first transparent window TW1 may form part of a wall of the reservoir RSV. The first transparent window TW1 may be transparent for at least the received input radiation frequencies, so that received input radiation IRD (or at least a large portion thereof) may be coupled into the optical fiber OF located inside reservoir RSV. It will be appreciated that optics (not shown) may be provided for coupling the input radiation IRD into the optical fiber OF.

The reservoir RSV comprises a second transparent window TW2, forming part of a wall of the reservoir RSV. In use, when the optical fiber OF is disposed inside the reservoir RSV, the second transparent window TW2 is located proximate to an output end OE of the optical fiber OF. The second transparent window TW2 may be transparent for at least the frequencies of the broadband output radiation ORD of the apparatus.

Alternatively, in another embodiment, the two opposed ends of the optical fiber OF may be placed inside different reservoirs. The optical fiber OF may comprise a first end section configured to receive input radiation IRD, and a second end section for outputting broadband output radiation ORD. The first end section may be placed inside a first reservoir, comprising a working medium WM. The second end section may be placed inside a second reservoir, wherein the second reservoir may also comprise a working medium WM. The functioning of the reservoirs may be as described in relation to FIG. 5 above. The first reservoir may comprise a first transparent window, configured to be transparent for input radiation IRD. The second reservoir may comprise a second transparent window configured to be transparent for broadband output broadband radiation ORD. The first and second reservoirs may also comprise a sealable opening to permit the optical fiber OF to be placed partially inside and partially outside the reservoir, so that a gas can be sealed inside the reservoir. The optical fiber OF may further comprise a middle section not contained inside a reservoir. Such an arrangement using two separate gas reservoirs may be particularly convenient for embodiments wherein the optical fiber OF is relatively long (for example when the length is more than 1 m). It will be appreciated that for such arrangements which use two separate gas reservoirs, the two reservoirs (which may comprise one or more features, known in the art, for controlling, regulating, and/or monitoring the composition of a gas inside the two reservoirs) may be considered to provide an apparatus for providing the working medium WM within the hollow core HC of the optical fiber OF.

In this context a window may be transparent for a frequency if at least 50%, 75%, 85%, 90%, 95%, or 99% of incident radiation of that frequency on the window is transmitted through the window.

Both the first TW1 and the second TW2 transparent windows may form an airtight seal within the walls of the reservoir RSV so that the working medium WM (which may be a gas) may be contained within the reservoir RSV. It will be appreciated that the gas WM may be contained within the reservoir RSV at a pressure different to the ambient pressure of the reservoir RSV.

The working medium WM may comprise a noble gas such as Argon, Krypton, and Xenon, a Raman active gas such as Hydrogen, Deuterium and Nitrogen, or a gas mixture such as an Argon/Hydrogen mixture, a Xenon/Deuterium mixture, a Krypton/Nitrogen mixture, Krypton/Helium, or a Nitrogen/Hydrogen mixture. Depending on the type of filling gas, the nonlinear optical processes can include modulational instability (MI), soliton self-compression, soliton fission, Kerr effect, Raman effect and dispersive wave generation, details of which are described in WO2018/127266A1 and U.S. Pat. No. 9,160,137B1 (both of which are hereby incorporated by reference). Since the dispersion of the filling gas can be tuned by varying the working medium WM pressure in the reservoir RSR (i.e. gas cell pressure), the generated broadband pulse dynamics and the associated spectral broadening characteristics can be adjusted so as to optimize the frequency conversion.

In one implementation, the working medium WM may be disposed within the hollow core HC at least during receipt of input radiation IRD for producing broadband output radiation ORD. It will be appreciated that, while the optical fiber OF is not receiving input radiation IRD for producing broadband output radiation, the gas WM may be wholly or partially absent from the hollow core COR.

In order to achieve frequency broadening high intensity radiation may be desirable. An advantage of having a hollow core optical fiber OF is that it may achieve high intensity radiation through strong spatial confinement of radiation propagating through the optical fiber OF, achieving high localised radiation intensities. The radiation intensity inside the optical fiber OF may be high, for example due to high received input radiation intensity and/or due to strong spatial confinement of the radiation inside the optical fiber OF. An advantage of hollow core optical fibers is that they can guide radiation having a broader wavelength range that solid-core fibers and, in particular, hollow core optical fibers can guide radiation in both the ultraviolet and infrared ranges.

An advantage of using a hollow core optical fiber OF may be that the majority of the radiation guided inside the optical fiber OF is confined to the hollow core COR. Therefore, the majority of the interaction of the radiation inside the optical fiber OF is with the working medium WM, which is provided inside the hollow core HC of the optical fiber OF. As a result, the broadening effects of the working medium WM on the radiation may be increased.

The received input radiation IRD may be electromagnetic radiation. The input radiation IRD may be received as pulsed radiation. For example, the input radiation IRD may comprise ultrafast pulses, for example, generated by a laser.

The input radiation IRD may be coherent radiation. The input radiation IRD may be collimated radiation, an advantage of which may be to facilitate and improve the efficiency of coupling the input radiation IRD into the optical fiber OF. The input radiation IRD may comprise a single frequency, or a narrow range of frequencies. The input radiation IRD may be generated by a laser. Similarly, the output radiation ORD may be collimated and/or may be coherent.

The broadband range of the output radiation ORD may be a continuous range, comprising a continuous range of radiation frequencies. The output radiation ORD may comprise supercontinuum radiation. Continuous radiation may be beneficial for use in a number of applications, for example in metrology applications. For example, the continuous range of frequencies may be used to interrogate a large number of properties. The continuous range of frequencies may for example be used to determine and/or eliminate a frequency dependency of a measured property. Supercontinuum output radiation ORD may comprise for example electromagnetic radiation over a wavelength range of 100 nm-4000 nm, or even up to 10 μm. The broadband output radiation ORD frequency range may be for example 400 nm-900 nm, 500 nm-900 nm, or 200 nm-2000 nm. The supercontinuum output radiation ORD may comprise white light.

The input radiation IRD provided by the pulsed pump radiation source PRS may be pulsed. The pulsed pump radiation source PRS may be a laser. The spatio-temporal transmission characteristics of such a laser pulse, e.g. its spectral amplitude and phase, transmitted along the optical fiber OF can be varied and tuned through adjustment of (pump) laser parameters, working component WM variations, and optical fiber OF parameters. Said spatio-temporal transmission characteristics may include one or more of: output power, output mode profile, output temporal profile, width of the output temporal profile (or output pulse width), output spectral profile, and bandwidth of the output spectral profile (or output spectral bandwidth). Said pulse pump radiation source PRS parameters may include one or more of: pump wavelength, pump pulse energy, pump pulse width, pump pulse repetition rate. Said optical fiber OF parameters may include one or more of: optical fiber length, size and shape of the hollow core 101, size and shape of the capillaries, thickness of the walls of the capillaries surrounding the hollow core. Said working component WM, e.g. filling gas, parameters may include one or more of: gas type, gas pressure and gas temperature.

The broadband output radiation ORD provided by the radiation source RDS may have an average output power of at least 1 W. The average output power may be at least 5 W. The average output power may be at least 10 W. The broadband output radiation ORD may be pulsed broadband output radiation ORD. The broadband output radiation ORD may have a power spectral density in the entire wavelength band of the output radiation of at least 0.01 mW/nm. The power spectral density in the entire wavelength band of the broadband output radiation may be at least 3 mW/nm.

Any laser source has an associated pulse-to-pulse amplitude variation, which gives rise to laser noise. This noise has a direct impact on the alignment position reproducibility (repro), which in turn directly affects the measured parameter of interest (e.g., overlay). It has been observed that, for at least some colors, a broadband source such as illustrated schematically in FIG. 5 has a noise level which is unacceptably high, which can have a significant impact on repro. While algorithms may exist to reduce the impact of laser noise, no algorithm is able to completely eliminate laser noise, and there will always be some laser noise present. This may still be too high for a given application.

Because this pulse-to-pulse noise is fundamental to the light generation process, there is currently no light-source-intrinsic direct solution to the problem. A complete redesign of the source to address this, even if possible, is undesirable in terms of effort, cost and complexity. Consequently, an indirect approach which reduces this noise downstream of the light source will be described, which can be implemented in addition (or as an alternative) to noise cancelling algorithms. In that case, the total noise reduction achieved will be even higher.

Figure 7:
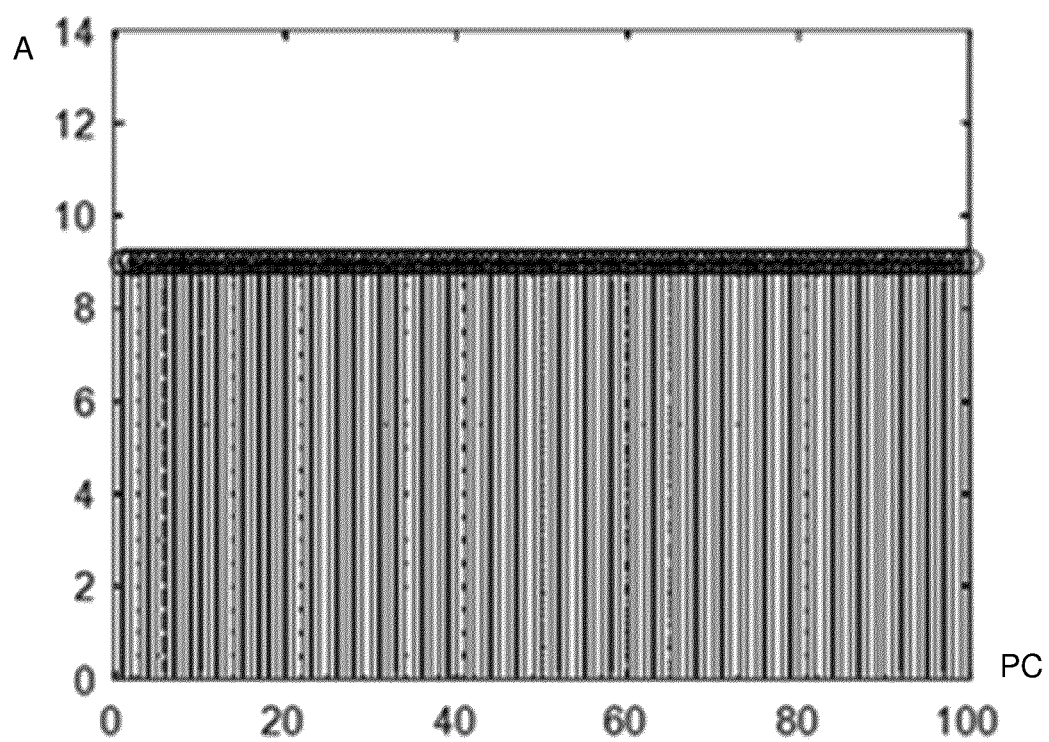
FIG. 7 is a plot of amplitude against pulse count for (a) a nominal perfect source not subject to noise; and (b) a realistic source illustrating the effect of radiation noise.
Figure 7:
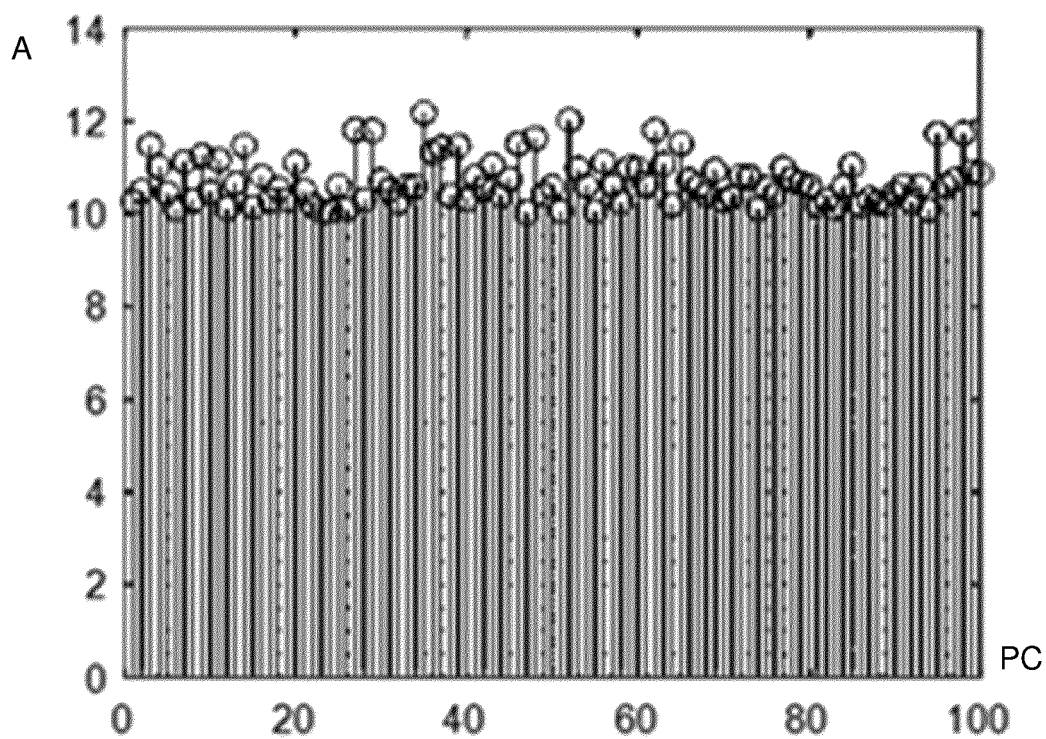

FIG. 7 illustrates the issue of laser noise. FIG. 7(*a*) shows a plot of amplitude A against pulse count PC (i.e., amplitudes of each individual pulse) for a hypothetical perfect source, where there is no pulse-to-pulse variation in amplitude. FIG. 7(b) shows an equivalent plot as may be seen for a real source, which shows the pulse-to-pulse amplitude variation described.

Figure 8:
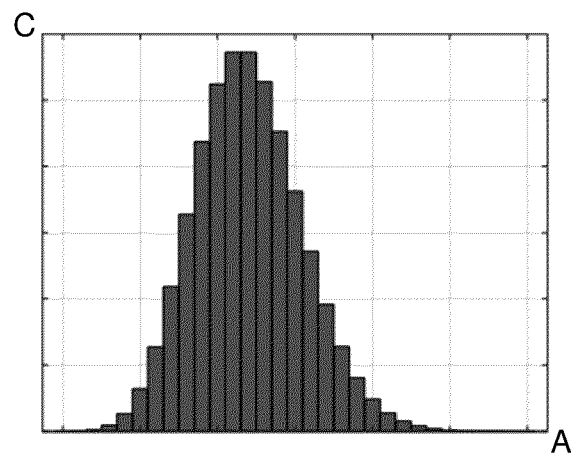
FIG. 8 comprises (a) a histogram illustrating an amplitude distribution for a prior art radiation source; (b) a histogram illustrating an amplitude distribution for a source arrangement according to an embodiment of the invention; and (c) a histogram illustrating overlaid input and output amplitude distributions for another example of a source arrangement according to an embodiment of the invention.
Figure 8:
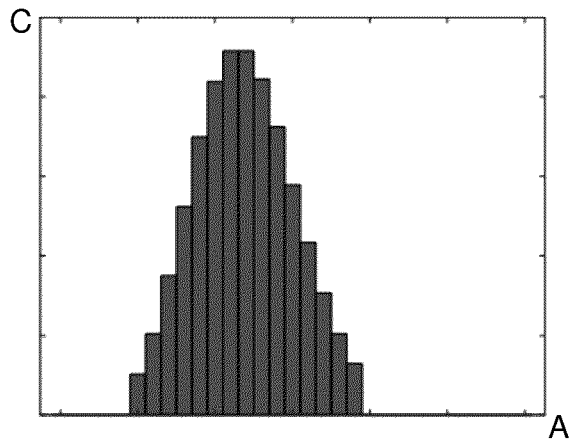
Figure 8:
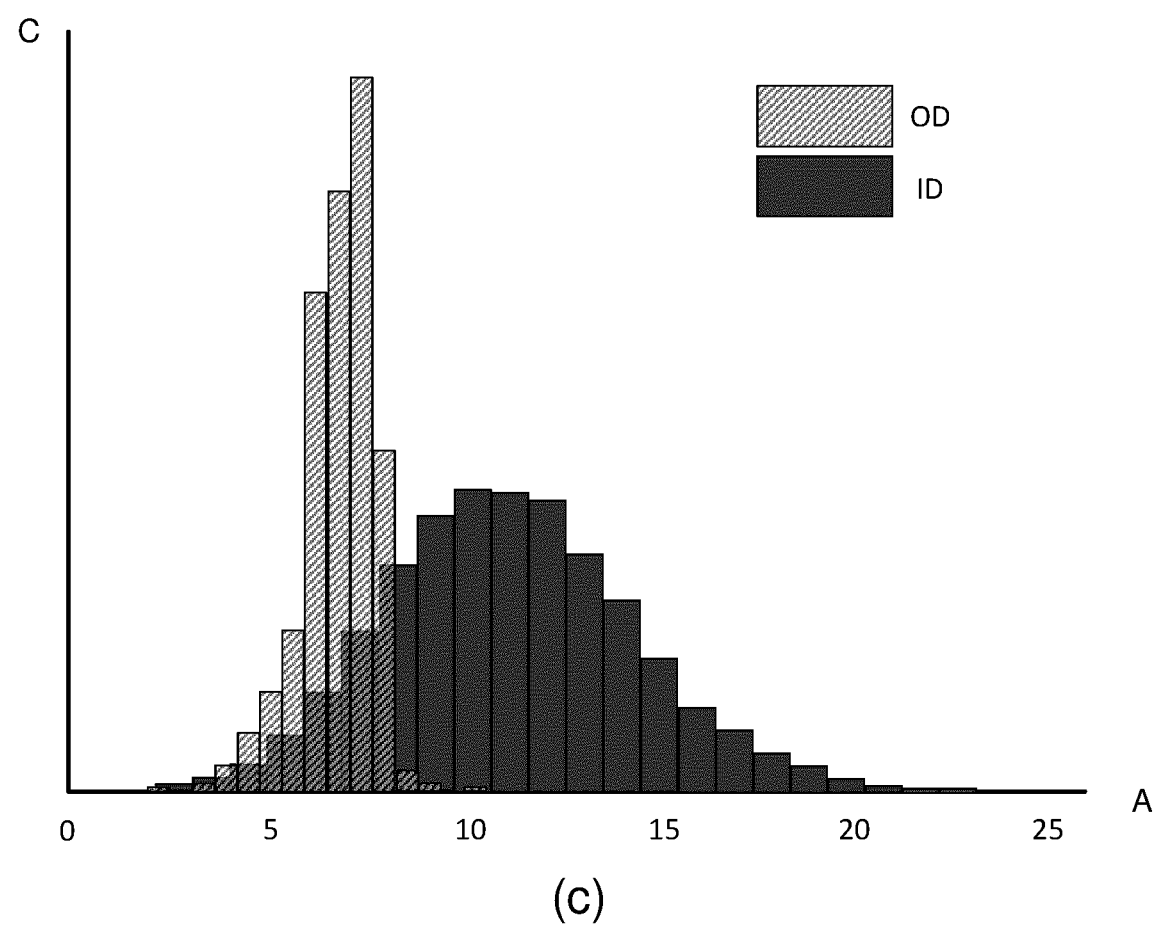

It is proposed to redistribute the pulse amplitude statistics using downstream optical elements. For an uncorrected source, the pulse amplitude statistics may follow a Poisson distribution, as illustrated in the histogram of FIG. 8(a), which shows the number of counts C for binned amplitude A. The proposed concept aims to reshape this distribution. Ideally, of course, the reshaping would result in a single spike with all values in a single amplitude bin. A more achievable improved distribution which may result from the concepts disclosed herein is shown in FIG. 8(b). This shows that the distribution tails of FIG. 8(a), corresponding to rarer events where pulse amplitudes are smallest/largest, have been removed. This may be achieved by simply removing these rarer pulses entirely (e.g., attenuating them to zero). Alternatively, or in addition these rarer pulses may be moved toward the center of the distribution, e.g., by attenuating only a portion of these pulses' energies (e.g., converting only a portion these pulses' energies into other energy forms). In an embodiment, a hybrid of these two approaches may be employed. More specifically, the high energy or high amplitude pulses may be partially attenuated to bring their energy or amplitude toward the average pulse energy, with only the excess energy being lost. The low energy pulses may be attenuated completely and effectively blocked.

In an embodiment, the optical elements may be such that most or all of the high energy or amplitude pulses having an energy or amplitude larger than a first threshold energy or amplitude level may be attenuated and/or most or all of the low energy or amplitude pulses having an energy or amplitude below than a second threshold energy or amplitude level may be attenuated.

The distribution of FIG. 8(b) is purely illustrative of the principle and unrealistic in practice, in that there is no attenuation of the majority of pulses (e.g., those nearer the peak of the distribution) and that all energies exactly larger or smaller than a threshold are cut off. However, due to the nature of the (passive) optical elements proposed, some attenuation of all pulses will be likely resulting in an overall shift of the output distribution (i.e., the distribution subsequent to the optical elements) with respect to an input distribution (i.e., the distribution prior to the optical elements). Furthermore, the cutoff will not be as sharp, such that some of the high energy/amplitude (above the first threshold) and/or low energy energy/amplitude (below the second threshold) may still be included in the output.

The concepts disclosed may relate to only (either) one of the distribution tails or both distribution tails. As such, the concepts disclosed may convert pulse energies larger than average towards the average of the output distribution and/or suppress/block pulse energies smaller than average.

To achieve this, energy absorbing optical elements may be used in the output (e.g., broadband) radiation path or alternatively the pump or seed radiation path. When in the output path of a broadband source, one or more energy absorbing optical elements may be provided per color band or color channel, for only specific color bands/channels (e.g., for only noisy channels such as those having a noise above a threshold) or one or more energy absorbing optical element may be used across the full output spectrum. The latter option may be preferred to reduce cost and complexity, while the other options may be preferred if greater flexibility is desired.

More specifically, a proposed source arrangement may attenuate a first subset of the source energy pulses, i.e., the higher source energy pulses, towards an average of a filtered energy pulse distribution using non-linear energy-filters or amplitude-filters such as optical power limiting elements (e.g., saturable absorption elements) and/or attenuate or block a second subset of the source energy pulses, i.e., the lower energy pulses, using non-linear energy filters or amplitude-filters such as reverse saturable absorption elements.

Saturable absorption elements comprise materials which have a nonlinear transmission, such that input pulses which have a higher energy/amplitude than average are attenuated more than those nearer the average. For example, input pulses with energy/amplitude higher than a first threshold may undergo greater attenuation than those between the first threshold and a second threshold; this range corresponding to a peak region of the input distribution. Input energy pulses lower than the second threshold may be attenuated to substantially zero (e.g., blocked) in which case it is referred to as a reverse saturable absorption element. As such, the output and/or separate color channels may each comprise a pair of non-linear amplitude-filters: e.g., a saturable absorption element and a reverse saturable absorption element.

FIG. 8(c) shows a more realistic (compared to the example shown in FIG. 8(b)) example of an output amplitude (or energy) distribution OD of filtered energy pulses overlaid with the input amplitude (or energy) distribution ID (e.g., a prior art distribution) of source energy pulses. The intensity values on the x-axis are in arbitrary units. The non-linear response of the proposed filters is used to shape or filter the input distribution ID which follows a Lorentzian distribution (in this specific example, the rate parameter is 12). It can be seen that the impact of the non-linear response is to reduce overall power (mean of distribution is shifted to the left), and to reduce distribution width (it becomes narrower and therefore less noisy). As such, the intensity of most or all of the pulses is reduced; however pulses corresponding to higher energies/intensities in the input distribution are attenuated more than those towards the peak of the input distribution, resulting in a significantly narrower distribution with taller peak. Those pulses corresponding to lower energies/intensities in the input distribution are also attenuated more than those towards the peak of the input distribution, more specifically they are essentially suppressed or blocked such that they do not appear in the output distribution.

Examples of non-linear amplitude-filter material usable as a (e.g., forward) saturable absorption element (i.e., for limiting higher than average amplitude pulses) include saturable absorber glasses such as:
  borosilicate glasses; such as borosilicate glass 3.3 (marketed as Duran (RTM) glass) or BK7 glass;
  ultra-low expansion (ULE) glasses, for example Titanium doped silicate glass (e.g., $7.5TiO_2$-$92.5SiO_2$);
  Sk3 glass; or
  any other suitable glass which has the same transmission characteristics as those listed above.

Other examples may comprise saturable absorber nanoparticle materials such as metal oxide nanoparticle materials (nanospheres/nanoellipsoids); e.g., $Co_3O_4$, $V_2O_5$, $Fe_2O_3$, $Mn_3O_4$, $Cr_2O_3$, and CuO nanospheres or nanoellipsoids.

Example non-linear amplitude-filter materials for reverse saturable absorption elements include:

Dichalcogenides or Transition metal dichalcogenide (TMD or TMDC) monolayers such as: $MoS_2$, $MoSe_2$, $WS_2$, $WSe_2$;

Nanoparticles such as $Cu_2O$—Ag nanoheterostructures;

Indanthrone compounds such as: Oxidized indanthrone, Monochloroindanthrone, Indanthrone Oligomer.

Some sources, such as a supercontinuum source illustrated in FIG. 5 (or a similar device using a solid core fiber), may generate pulses which have insufficient pulse energy (or more relevantly pulse intensity) for the desired non-linear response in the non-linear amplitude-filter material or saturable absorber materials. Therefore, embodiments disclosed herein may include using focusing optics to increase the light intensity (i.e., energy/area) at the saturable absorption element(s); e.g., focus the light on the saturable absorption elements, to ensure the desired non-linear response. Such focusing elements are optional and only required where the intensity of the source output is insufficient to obtain the desired non-linear response in the non-linear amplitude-filter material(s).

Figure 9:
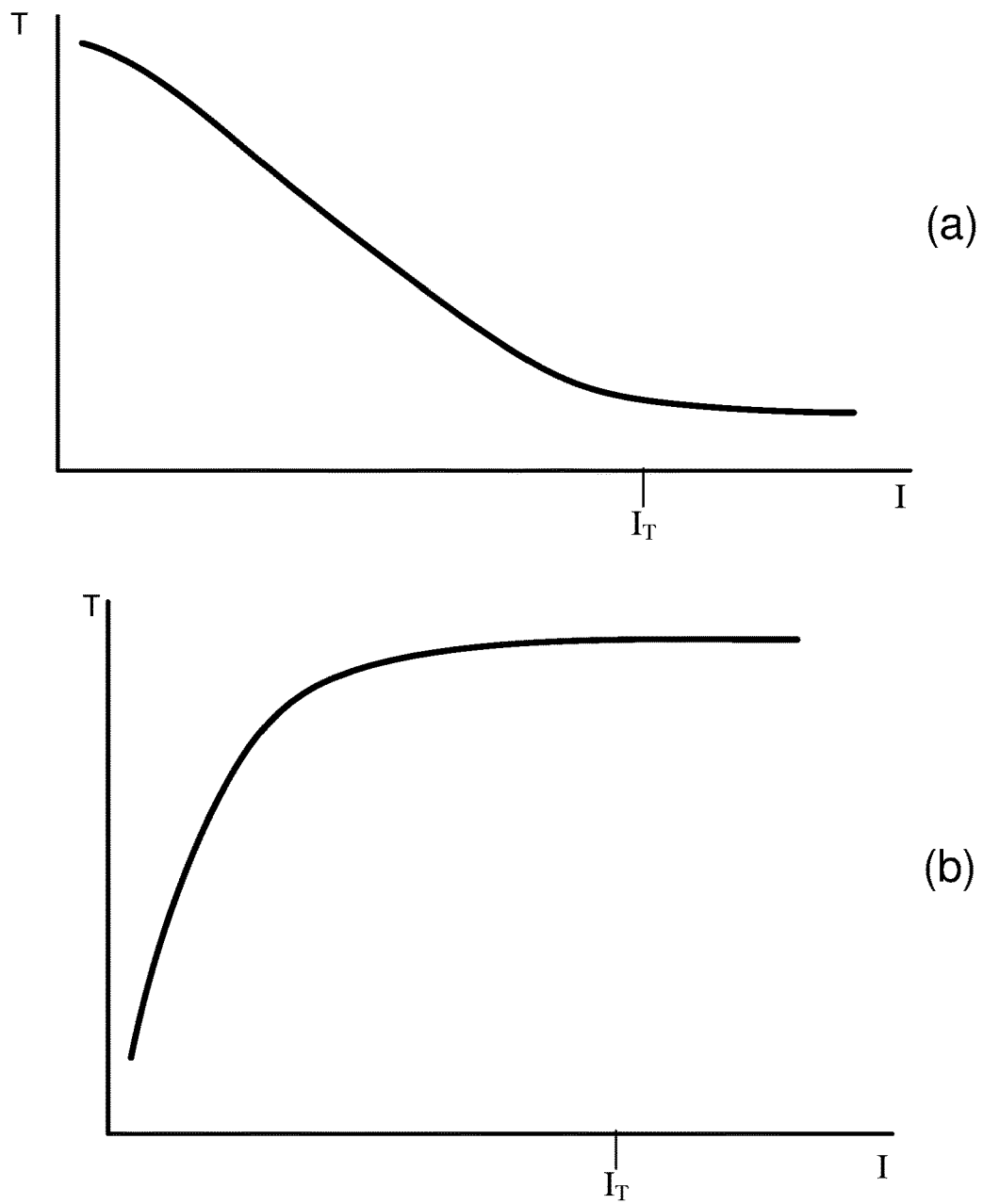
FIG. 9 comprises a plot of transmittance against input intensity for (a) a saturable absorption element and (b) a reverse saturable absorption element.

FIG. 9(a) is a plot of transmission against intensity which illustrates a typical non-linear response which may be observed for a typical (forward) saturable absorption element, while FIG. 9(b) is an equivalent plot which may be observed for a typical reverse saturable absorption element. An issue with these materials is that the nonlinear behavior only begins at an intensity threshold $I_T$ which is typically above the intensity output of many sources (e.g., a source similar to that of FIG. 5). Such a source may, for example, have a pump pulse energy of about 5 µJ and a 300 fs pulse width. Assuming that the broadband output spectrum is relatively flat and has a spectral width of about 1000 nm, the energy of a 10 nm spectral filtered band is about 50 nJ. Further assuming that the pulse duration is similar to the pump, the peak power will be in the region of 160 kW. Assuming a beam radius is 2.5 mm, results in an intensity of 0.8 $MW/cm^2$, which is significantly below the intensity threshold $I_T$.

However, by providing a focusing lens, the beam radius may be made significantly smaller and therefore the intensity larger such that it is above the intensity threshold $I_T$. A focusing element, for example, having an NA=0.7 would result in a radius down to 10 µm and intensity of 50 $GW/cm^2$. This is an order of magnitude higher than required for SK3 glass (for example), but other materials may have larger nonlinear thresholds. Note that all the values provided in this example are purely exemplary to illustrate the principle of using a focusing element. The relevant values may vary significantly depending on the type of source used.

Figure 10:
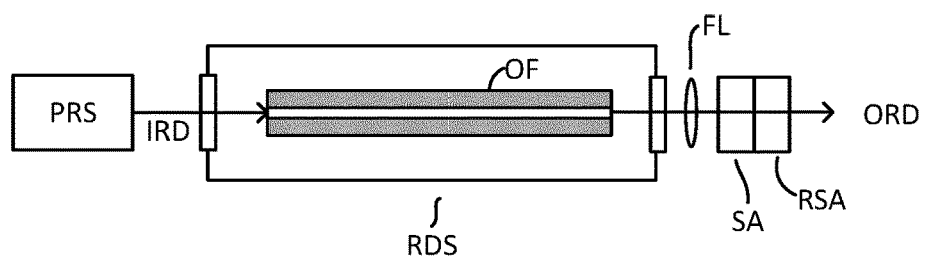
FIG. 10 is a schematic illustration of a source arrangement according to an embodiment of the invention.

FIG. 10 is a schematic illustration of a source arrangement according to the concepts described. As with the arrangement of FIG. 5, the radiation source RDS comprises a pulsed pump radiation source PRS generating input radiation IRS and an optical fiber OF. The broadband radiation generated within the optical fiber OF is focused by focusing element FL on or around a saturable absorber SA and reverse saturable absorber RSA, resulting in a less noisy output radiation beam ORD.

The example has largely been described in terms of using the proposed non-linear amplitude-filter(s) on the output radiation pulses (e.g., per channel or otherwise). However, it may be beneficial to filter the seed laser directly. The seed laser is typically orders of magnitude more powerful than the output laser, and therefore the non-linear region of the material's optical response may be reached without needing a focusing element. On the other hand, while current sources based on hollow core fibers might not presently produce high enough energy pulses for the output radiation without focusing optics, this may change in future. As such, concepts disclosed herein may comprise filtering the seed laser radiation with or without focusing optics (which are very unlikely to be required) or filtering the output radiation with or without focusing optics.

The concepts herein may be used for noise reduction in other types of radiation sources from those described. For example, other such radiation sources may comprise those for the generation of EUV, hard X-ray or soft X-ray radiation based on high harmonic generation (HHG) techniques; e.g., such as described in PCT application WO2017186491A1 (incorporated herein by reference). Such HHG sources may comprise a gas delivery system for delivering a HHG generation medium (gas) and a pump radiation source operable to emit the pump radiation to excite the HHG generation medium. It is proposed that the concepts described herein may act on the pump pulses and therefore reduce noise in the (compressed) pump pulses before they interact with the gas medium. Other illumination sources for which the concepts are also applicable may include, e.g., liquid metal jet sources, inverse Compton scattering (ICS) sources, plasma channel sources, magnetic undulator sources or free electron laser (FEL) sources. The radiation source may be a narrowband source providing a narrowband output, rather than the broadband sources described. Ultimately, the concepts herein are applicable to any radiation source for which laser noise (pulse-to-pulse amplitude or energy variation) is a problem.

Depending on the materials used, laser noise may be reduced by an order of magnitude using the concepts described herein. This may be achieved without incurring large costs since the materials and parts required are simple. Moreover, no power or size limitations exist, since the parts are expected to occupy small volume.

The concepts described herein may be applied to only one or a subset of available color channels or wavelength bands (where the source has a broadband output). For example, if the output comprises bands for which only a subset have an intensity above the intensity threshold, then it is possible to provide non-linear amplitude-filter(s) to only this subset of bands, or else apply the filter(s) without a focusing element to this subset, while using the filter(s) with a focusing element to other bands.

While the concepts described herein refer to transmissive energy absorbing optical elements or saturable absorption elements, the concepts described can also be achieved using reflective non-linear amplitude-filters (e.g., reflective energy absorbing optical elements or saturable absorption elements) and reflective focusing elements (which may include suitably engineered metamaterials).

While the radiation source described herein is disclosed in the context of providing measurement radiation in a lithographic or IC manufacturing setting, it is not so limited and may be used to provide measurement illumination or illumination for another purpose outside of a lithographic or IC manufacturing setting. The source disclosed herein may be used in any situation where source noise is an issue.

Further embodiment are disclosed in the subsequent list of numbered clauses:

1. A radiation source arrangement comprising;
   a radiation source operable to generate source radiation comprising source energy pulses; and at least one non-linear energy-filter being operable to filter said source radiation to obtain filtered radiation comprising filtered energy pulses;

wherein said at least one non-linear energy-filter is operable to mitigate variation in energy in said filtered radiation by reducing the energy level of said source energy pulses which have an energy level corresponding to one of both extremities of an energy distribution of said source energy pulses by a greater amount than said source energy pulses which have an energy level corresponding to a peak of said energy distribution.
2. A radiation source arrangement as defined in clause 1, wherein the at least one non-linear energy-filter comprises at least one non-linear amplitude-filter being operable to mitigate variation in amplitude in said filtered radiation by reducing the amplitude level of said source energy pulses which have an amplitude level corresponding to one of both extremities of an amplitude distribution of said source energy pulses by a greater amount than said source energy pulses which have an amplitude level corresponding to a peak of said amplitude distribution.
3. A radiation source arrangement as defined in clause 2, wherein the at least one non-linear amplitude-filter comprises a non-linear characteristic such that for at least some of a first subset of said source energy pulses comprising those source energy pulses which have an amplitude level above a peak amplitude in the amplitude distribution: the greater the amplitude level of the source energy pulse, the greater the degree of attenuation of said amplitude level.
4. A radiation source arrangement as defined in clause 3, wherein said first subset of source energy pulses comprise those which have an amplitude level higher than a first threshold amplitude level.
5. A radiation source arrangement as defined in clause 3 or 4, wherein the at least one non-linear amplitude-filter is operable to lower the amplitude level of said first subset of source energy pulses to an amplitude level nearer an average for an amplitude distribution of the filtered energy pulses.
6. A radiation source arrangement as defined in clause 3, 4 or 5, wherein the at least one non-linear amplitude-filter comprises at least one saturable absorption element.
7. A radiation source arrangement as defined in clause 6, wherein said at least one saturable absorption element comprises a saturable absorber glass or saturable absorber nanoparticle material.
8. A radiation source arrangement as defined in clause 7, wherein the saturable absorber glass comprises: a borosilicate glass, an ultra-low expansion glass, an Sk3 glass.
9. A radiation source arrangement as defined in clause 7, wherein the saturable absorber nanoparticle material comprises a metal oxide nanosphere or nanoellipsoid material.
10. A radiation source arrangement as defined in any of clauses 2 to 9, wherein the at least one non-linear amplitude-filter comprises a non-linear characteristic such that for at least some or most of a second subset of said source energy pulses comprising those source energy pulses having an amplitude level lower than a second threshold amplitude level, the amplitude level is suppressed.
11. A radiation source arrangement as defined in clause 10, wherein said suppression is such that at least some or most of the second subset of said source energy pulses are attenuated to a substantially zero or nominal amplitude level.
12. A radiation source arrangement as defined in clause 10 or 11, wherein the at least one non-linear amplitude-filter comprises a reverse saturable absorption element.
13. A radiation source arrangement as defined in clause 12, wherein the reverse saturable absorption element comprises a Dichalcogenide or Transition metal dichalcogenide monolayers, a $Cu_5O$—Ag nanoheterostructure or an indanthrone compound.
14. A radiation source arrangement as defined in any preceding clause, wherein the at least one non-linear energy-filter is located at an output of the radiation source.
15. A radiation source arrangement as defined in clause 14, comprising a plurality of said at least one non-linear energy-filters such that separate at least one non-linear energy-filters are provided for different wavelength bands of the output radiation.
16. A radiation source arrangement as defined in clause 14 or 15, comprising at least one focusing element to reduce a beam area of said output radiation on said at least one non-linear energy-filter.
17. A radiation source arrangement as defined in any of clauses 1 to 13, wherein the radiation source comprises a pump or seed laser for generating input radiation and a medium for exciting by said input radiation and the at least one non-linear energy-filter is located in the path of the input radiation.
18. A radiation source arrangement as defined in any preceding clause, wherein the output radiation comprises broadband output radiation.
19. A radiation source arrangement as defined in clause 18, wherein said output radiation comprises wavelengths smaller than 400 nm.
20. A radiation source arrangement as defined in clause 18 or 19, wherein the radiation source comprises a hollow core fiber comprising a working medium and an optical input for receiving input radiation so as to excite said working medium to generate said broadband output radiation.
21. A radiation source arrangement as defined in clause 20, wherein the hollow core fiber comprises a hollow-core photonic crystal fiber.
22. A metrology device comprising the radiation source arrangement of any preceding clause, wherein the radiation source arrangement is configured to generate radiation for projection onto a substrate.
23. The metrology device of clause 22, wherein the metrology device is one of: a scatterometer, an alignment sensor or a levelling sensor.
a. A radiation source arrangement comprising;
a radiation source operable to generate source radiation comprising source energy pulses; and at least one non-linear energy-filter being operable to filter said source radiation to obtain filtered radiation comprising filtered energy pulses;
wherein said at least one non-linear energy-filter is operable to mitigate variation in energy in said filtered radiation by reducing the energy level of said source energy pulses which have an energy level corresponding to one or both extremities of an energy distribution of said source energy pulses by a greater amount than said source energy pulses which have an energy level corresponding to a peak of said energy distribution.
b. A radiation source arrangement as defined in clause a, wherein the at least one non-linear energy-filter comprises at least one non-linear amplitude-filter being operable to mitigate variation in amplitude in said filtered radiation by reducing the amplitude level of said source energy pulses which have an amplitude level corresponding to one or both extremities of an amplitude distribution of said source energy pulses by a greater amount than said source energy pulses which have an amplitude level corresponding to a peak of said amplitude distribution.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

While specific embodiments of the invention have been described above, it will be appreciated that the invention may be practiced otherwise than as described.

The descriptions above are intended to be illustrative, not limiting. Thus it will be apparent to one skilled in the art that modifications may be made to the invention as described without departing from the scope of the claims set out below.

The invention claimed is:

1. A radiation source arrangement comprising:
a radiation source configured to generate source radiation comprising source energy pulses; and
at least one non-linear energy-filter configured to filter the source radiation to obtain filtered radiation comprising filtered energy pulses,
wherein the at least one non-linear energy-filter is configured to mitigate variation in energy in the filtered radiation by reducing the energy level of the source energy pulses which have an energy level corresponding to one of both extremities of an energy distribution of the source energy pulses by a greater amount than the source energy pulses which have an energy level corresponding to a peak of the energy distribution.

2. The radiation source arrangement as claimed in claim 1, wherein the at least one non-linear energy-filter comprises at least one non-linear amplitude-filter configured to mitigate variation in amplitude in the filtered radiation by reducing the amplitude level of the source energy pulses which have an amplitude level corresponding to one of both extremities of an amplitude distribution of the source energy pulses by a greater amount than the source energy pulses which have an amplitude level corresponding to a peak of the amplitude distribution.

3. The radiation source arrangement as claimed in claim 2, wherein the at least one non-linear amplitude-filter comprises a non-linear characteristic such that for at least some or most of a second subset of the source energy pulses comprising those source energy pulses having an amplitude level lower than a second threshold amplitude level, the amplitude level is suppressed.

4. The radiation source arrangement as claimed in claim 3, wherein the at least one non-linear amplitude-filter comprises a reverse saturable absorption element.

5. The radiation source arrangement as claimed in claim 4, wherein the reverse saturable absorption element comprises a dichalcogenide or transition metal dichalcogenide monolayers, a CusO-Ag nanohetero structure or an indanthrone compound.

6. The radiation source arrangement as claimed in claim 3, wherein the suppression is such that at least some or most of the second subset of the source energy pulses are attenuated to a substantially zero or nominal amplitude level.

7. The radiation source arrangement as claimed in claim 2, wherein the at least one non-linear amplitude-filter comprises a non-linear characteristic such that for at least some of a first subset of the source energy pulses comprising those source energy pulses which have an amplitude level above a peak amplitude in the amplitude distribution: the greater the amplitude level of the source energy pulse, the greater the degree of attenuation of the amplitude level.

8. The radiation source arrangement as claimed in claim 7, wherein the first subset of source energy pulses comprise those which have an amplitude level higher than a first threshold amplitude level.

9. The radiation source arrangement as claimed in claim 7, wherein the at least one non-linear amplitude-filter is configured to lower the amplitude level of the first subset of source energy pulses to an amplitude level nearer an average for an amplitude distribution of the filtered energy pulses.

10. The radiation source arrangement as claimed in claim 7, wherein the at least one nonlinear amplitude-filter comprises at least one saturable absorption element.

11. The radiation source arrangement as claimed in claim 7, wherein the at least one saturable absorption element comprises a saturable absorber glass or saturable absorber nanoparticle material.

12. The radiation source arrangement as claimed in claim 11, wherein:
the at least one saturable absorption element comprises a saturable absorber glass and the saturable absorber glass comprises: a borosilicate glass, an ultra-low expansion glass, or an Sk3 glass, and/or
the at least one saturable absorption element comprises a saturable absorber nanoparticle material and the saturable absorber nanoparticle material comprises a metal oxide nanosphere or nanoellipsoid material.

13. The radiation source arrangement as claimed in claim 1, wherein the at least one non-linear energy-filter is located at an output of the radiation source.

14. The radiation source arrangement as claimed in claim 13, comprising at least one focusing element to reduce a beam area of the output radiation on the at least one non-linear energy-filter.

15. The radiation source arrangement as claimed in claim 13, wherein the output radiation comprises broadband output radiation comprising wavelengths smaller than 400 nm.

16. The radiation source arrangement as claimed in claim 13, wherein the radiation source arrangement comprises a plurality of the at least one non-linear energy-filters such that separate at least one non-linear energy-filters are provided for different wavelength bands of the output radiation.

17. The radiation source arrangement as claimed in claim 1, wherein the radiation source comprises a hollow core fiber comprising a working medium and an optical input for receiving input radiation so as to excite the working medium to generate the broadband output radiation.

18. The radiation source arrangement as claimed in claim 1, wherein the radiation source comprises a pump or seed laser configured to generate input radiation and a medium configured to be excited by the input radiation and the at least one non-linear energy-filter is located in the path of the input radiation.

19. A metrology device comprising the radiation source arrangement of claim 1, wherein the radiation source arrangement is configured to generate radiation for projection onto a substrate.

20. The metrology device as claimed in claim 19, wherein the metrology device is a scatterometer, an alignment sensor or a levelling sensor.

* * * * *